(12) United States Patent
Cheng

(10) Patent No.: US 10,062,985 B2
(45) Date of Patent: Aug. 28, 2018

(54) CONNECTOR MODULE AND PORTABLE ELECTRONIC DEVICE

(71) Applicant: PEGATRON CORPORATION, Taipei (TW)

(72) Inventor: Tung-Ting Cheng, Taipei (TW)

(73) Assignee: Pegatron Corporation, Taipei (TW)

( * ) Notice: Subject to any disclaimer, the term of this patent is extended or adjusted under 35 U.S.C. 154(b) by 0 days.

(21) Appl. No.: 15/690,915

(22) Filed: Aug. 30, 2017

(65) Prior Publication Data

US 2018/0069330 A1 Mar. 8, 2018

(30) Foreign Application Priority Data

Sep. 7, 2016 (TW) .............................. 105128934 A

(51) Int. Cl.
*H01R 12/70* (2011.01)
*G06K 13/08* (2006.01)
(Continued)

(52) U.S. Cl.
CPC ......... *H01R 12/7094* (2013.01); *G06K 13/00* (2013.01); *G06K 13/0831* (2013.01);
(Continued)

(58) Field of Classification Search
CPC ................ H01R 12/7094; H01R 12/62; H01R 12/7076; H01R 12/714; H05K 1/14; H05K 5/0247; H05K 5/0026; H05K 5/0086; H05K 5/0217; H04B 1/3816; G06K 13/0831; G06K 13/08; G06K 13/0806;
(Continued)

(56) References Cited

U.S. PATENT DOCUMENTS 5,655,917 A * 8/1997 Kaneshige ............. G06K 13/08
439/155
6,602,096 B1 * 8/2003 Kronestedt .......... G06K 7/0021
439/188
(Continued)

FOREIGN PATENT DOCUMENTS

CN 101632331 A 1/2010
CN 103855528 A 6/2014
(Continued)

*Primary Examiner* — Dimary Lopez Cruz
*Assistant Examiner* — Abhishek Rathod
(74) *Attorney, Agent, or Firm* — Muncy, Geissler, Olds & Lowe, P.C.

(57) ABSTRACT

A connector module is mounted at a portable electronic device. The portable electronic device includes a housing and a circuit board. The circuit board is disposed in the housing, and the housing has an opening. The connector module includes a switch component, a connector and a button assembly. The switch component is disposed at the housing and is electrically connected with the circuit board. The connector is movably disposed between the opening and the switch component, and the connector is electrically connected with the circuit. The connector is for accommodating an IC card, so that the IC card is capable of being electrically connected with the circuit board via the connector. The button assembly is inserted at the opening and abuts against the connector, and drives the connector to touch the switch component when being pressed.

20 Claims, 4 Drawing Sheets

(51) Int. Cl.
*H01R 12/62* (2011.01)
*H01R 12/71* (2011.01)
*H05K 1/14* (2006.01)
*H05K 5/00* (2006.01)
*H05K 5/02* (2006.01)
*G06K 13/00* (2006.01)

(52) U.S. Cl.
CPC ......... *H01R 12/62* (2013.01); *H01R 12/7076* (2013.01); *H01R 12/714* (2013.01); *H05K 1/14* (2013.01); *H05K 5/0026* (2013.01); *H05K 5/0086* (2013.01); *H05K 5/0217* (2013.01); *H05K 5/0247* (2013.01); *G06K 13/08* (2013.01); *G06K 13/0825* (2013.01)

(58) Field of Classification Search
CPC ........... G06K 13/0825; G06K 13/0818; G06K 13/0812; G06K 13/06; G06K 13/00
See application file for complete search history.

(56) References Cited

U.S. PATENT DOCUMENTS

| | | | | |
|---|---|---|---|---|
| 7,112,075 B1* | 9/2006 | Su | ........................ | G06K 7/0021 439/159 |
| 7,125,258 B2* | 10/2006 | Nakakubo | ........ | G06K 19/07741 439/64 |
| 7,442,086 B1* | 10/2008 | Chang | ................ | H01R 13/6205 439/305 |
| 7,837,092 B2* | 11/2010 | Wen | .................... | G06K 13/0806 235/375 |
| 7,988,454 B1* | 8/2011 | Liu | ........................ | G06K 13/08 439/38 |
| 8,371,866 B1* | 2/2013 | Su | ...................... | G06K 13/0862 439/159 |
| 8,432,682 B2* | 4/2013 | Quan | ................. | G06K 13/0825 361/679.38 |
| 8,926,345 B2* | 1/2015 | Kim | ................... | G06K 13/0825 439/142 |
| 9,077,109 B1* | 7/2015 | Lin | ..................... | G06K 13/0812 |
| 9,264,087 B2* | 2/2016 | Lin | ...................... | H04B 1/3818 |
| 9,387,647 B2* | 7/2016 | Wei | ...................... | H04B 1/3816 |
| 9,680,243 B2* | 6/2017 | Shimotsu | ............ | H01R 12/7076 |
| 9,787,342 B2* | 10/2017 | Kole | .................. | H04B 1/3816 |
| 9,875,432 B2* | 1/2018 | Motohashi | ......... | G06K 13/0831 |
| 2003/0101303 A1* | 5/2003 | Kung | ...................... | G06F 1/1626 710/301 |
| 2006/0231619 A1* | 10/2006 | Lee | ...................... | G06K 13/08 235/441 |
| 2006/0274511 A1* | 12/2006 | Choi | ...................... | G06K 13/08 361/754 |
| 2008/0064239 A1* | 3/2008 | Li | ........................ | H01R 13/635 439/152 |
| 2008/0096606 A1* | 4/2008 | Park | ...................... | G06K 7/0021 455/558 |
| 2008/0165508 A1* | 7/2008 | Wang | .................... | H04M 1/026 361/728 |
| 2009/0035977 A1* | 2/2009 | Chen | .................... | G06K 7/0021 439/326 |
| 2009/0047835 A1* | 2/2009 | Lin | ........................ | G06K 13/08 439/632 |
| 2009/0191746 A1* | 7/2009 | Ma | .................... | H01R 13/65802 439/350 |
| 2009/0267677 A1* | 10/2009 | Myers | .................... | G06K 13/08 327/356 |
| 2010/0079933 A1* | 4/2010 | Liang | .................... | H01R 13/635 361/679.01 |
| 2010/0093412 A1* | 4/2010 | Serra | .................... | H04B 1/3888 455/575.8 |
| 2011/0058327 A1* | 3/2011 | Chen | .................... | H05K 5/0282 361/679.32 |
| 2011/0255252 A1* | 10/2011 | Sloey | .................... | H04B 1/3816 361/752 |
| 2012/0134083 A1* | 5/2012 | Tang | .................... | H04B 1/3816 361/679.01 |
| 2012/0162925 A1* | 6/2012 | Luo | .................... | G06K 13/0825 361/727 |
| 2012/0195013 A1* | 8/2012 | Trzaskos | ............ | G06K 13/0831 361/754 |
| 2012/0224330 A1* | 9/2012 | Liu | ........................ | G06F 1/1656 361/726 |
| 2012/0307451 A1* | 12/2012 | Shukla | .................. | G06F 1/1658 361/699 |
| 2013/0044438 A1* | 2/2013 | Tang | .................... | G06K 13/08 361/737 |
| 2013/0063910 A1* | 3/2013 | Chao | .................... | G06F 1/1656 361/754 |
| 2013/0094162 A1* | 4/2013 | Tang | .................. | G06K 13/0831 361/754 |
| 2013/0140204 A1* | 6/2013 | Duan | ................ | G06K 13/0831 206/320 |
| 2013/0267106 A1* | 10/2013 | Jenks | .................... | G11B 17/00 439/160 |
| 2013/0334948 A1* | 12/2013 | Chung | ................ | H05K 7/1461 312/333 |
| 2014/0078660 A1* | 3/2014 | Dondzik | ............. | H04B 1/3816 361/679.31 |
| 2014/0154926 A1* | 6/2014 | Cao | ........................ | G06K 7/04 439/634 |

FOREIGN PATENT DOCUMENTS

TW      I376180 B    11/2012
TW      I402021 B1   7/2013

\* cited by examiner

CONNECTOR MODULE AND PORTABLE ELECTRONIC DEVICE

CROSS-REFERENCE TO RELATED APPLICATIONS

This application claims the priority benefits of Taiwan Patent Application No. 105128934, filed on Sep. 7, 2016. The entirety of the above-mentioned patent applications are hereby incorporated by references herein and made a part of specification.

BACKGROUND

Field of Invention

The disclosure relates to a connector module and, in particular, to a connector module for a portable electronic device.

Related Art

A modern portable electronic device having telecommunication functionalities, such as a mobile phone or a tablet PC, must have a SIM (Subscriber Identification Module) connector for a user to insert a SIM card so that the mobile phone or the tablet PC can access information related to the user's phone number stored on the SIM card. Moreover, due to the limited capacity of the build-in memory of the portable electronic device, a portable electronic device may include an internal memory card connector for the user to insert a memory card to the internal connector to expand the memory capacity.

Currently, a portable electronic device has an opening formed on the sidewall of the housing, and the connector is disposed in the portable electronic device near the opening. The SIM card or the memory card can be electrically connected with the connector after being inserted at the opening.

Furthermore, except for the opening for the SIM card or the memory card, the housing of the portable electronic device may also have a button, such as the power button or the volume-adjusting button, which also requires an opening formed on the housing to be assembled.

Therefore, the housing of a portable electronic device must have different openings for the insertion of an IC card (such as the SIM card or the memory card) and the assembling of the button. However, in addition to the unattractive appearance, to form multiple openings on the housing also reduces the usage rate of the internal space of the portable device since both the connector and the button need to be disposed by forming openings on the housing.

SUMMARY

An objective of the invention is to provide a connector module, which can integrate the structures and functions of the connector for an IC card and a button to save space and improve the aesthetic effect of a portable electronic device.

To achieve the above objective, one embodiment of the invention provides a connector module mounted at a portable electronic device. The portable electronic device includes a housing and a circuit board, the circuit board being disposed in the housing, and the housing having an opening. The connector module includes a switch component, a connector and a button assembly. The switch module is disposed at the housing and is electrically connected with the circuit board. The connector is disposed between the opening and the switch component and is electrically connected with the circuit board. The connector is for accommodating an IC card, so that the IC card is capable of being electrically connected with the circuit board via the connector. The button assembly is inserted at the opening and abuts against the connector, and the button assembly drives the connector to touch the switch component when being pressed.

To achieve the above objective, the embodiment of the invention further provides a portable electronic device, which includes a housing, a circuit board and a connector module. The housing has an opening, and the circuit board is disposed in the housing. The connector module includes a switch component, a connector and a button assembly. The switch module is disposed at the housing and is electrically connected with the circuit board. The connector is disposed between the opening and the switch component and is electrically connected with the circuit board. The connector is for accommodating an IC card, so that the IC card is capable of being electrically connected with the circuit board via the connector. The button assembly is inserted at the opening and abuts against the connector, and the button assembly drives the connector to touch the switch component when being pressed.

According to an embodiment, the connector includes an accommodation housing for accommodating the IC card. The button assembly includes a button portion and a bearing portion. One end of the button portion is protruded from the opening, and another end of the button portion abuts against the accommodation housing. The bearing portion bears the IC card and is inserted at the accommodation housing.

According to an embodiment, when the button portion is pressed to make the connector move toward the switch component and touch the switch component, the switch component generates a triggering signal to the circuit board.

According to an embodiment, when the button portion is stopped to be pressed, the connector moves away from the switch component to separate the connector from the switch component.

According to an embodiment, the switch component further includes an elastic member disposed in parallel to a moving direction of the connector. When the connector touches the switch component, the elastic member is compressed, and when the button portion is stopped to be pressed, the elastic member provides a restoring force to the connector so that the connector moves away from the switch component.

According to an embodiment, the connector includes an elastic member disposed in parallel to a moving direction of the connector. When the button portion is pressed, the connector moves toward the switch component, the elastic member is stretched, and when the button portion is stopped to be pressed, the elastic member provides a restoring force to the connector so that the connector moves away from the switch component.

According to an embodiment, the distance from the switch component to the opening is longer than the length of one of the side edges of the connector, and the side edge is in parallel to a moving direction of the connector.

According to an embodiment, the connector module further includes at least two first position-limiting members disposed at the housing. The two first position-limiting members are located at two relative side edges of the connector, respectively, and the two side edges being in parallel to a moving direction of the connector.

According to an embodiment, the connector module further includes at least one first position-limiting member disposed at the housing. The connector has at least one second position-limiting member co-operating with the first position-limiting member, and the connector is capable of driving the second position-limiting member to move with respect to the first position-limiting member.

According to an embodiment, the first position-limiting member is a convex post, the second position-limiting member is a rail, and the convex post is disposed at the rail.

To sum up, according to the invention, the connector module and the portable electronic device mounted with such connector module include a switch component, a connector and a button assembly. The connector is for accommodating an IC card, and the IC card is electrically connected with the circuit board of the portable electronic device via the connector to achieve the basic function of the connector. The connector of the invention is movably disposed between the opening and the switch component and the button assembly abuts against the connector. With this structure, when a user presses the button assembly, the connector is driven to move and touch the switch component to achieve the effect of triggering the switch component. Therefore, the connector module of the invention integrates the structures and functions of both the connector and the button. Except for saving space, the invention further reduces the number of the openings of the housing of the portable electronic device, which enhance the aesthetic effect.

DETAILED DESCRIPTION OF THE EMBODIMENT

The present invention will be apparent from the following detailed description, which proceeds with reference to the accompanying drawings, wherein the same references relate to the same elements.

Figure 1:
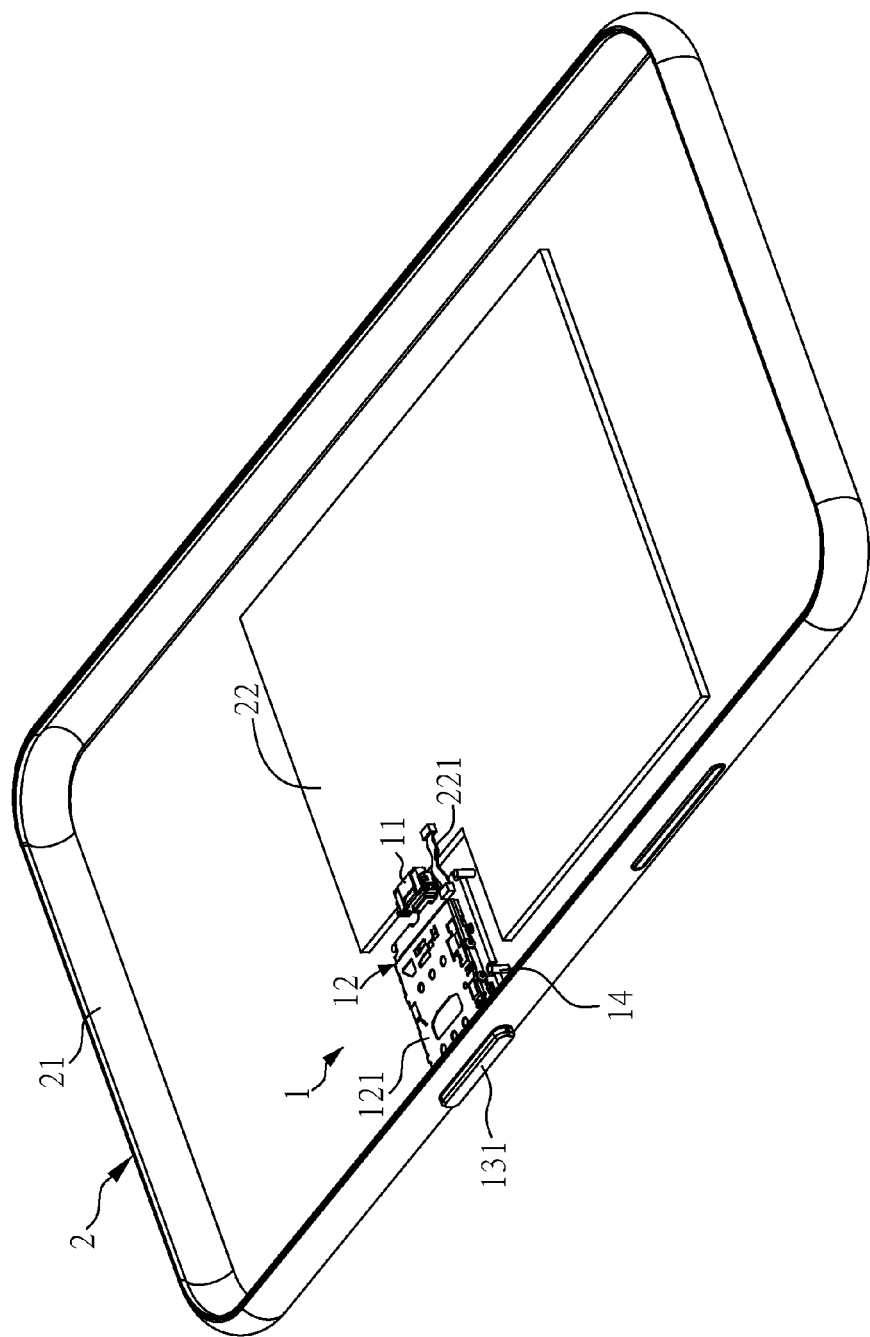
FIG. 1 is a schematic diagram of the connector module according to an embodiment of the invention.
Figure 2:
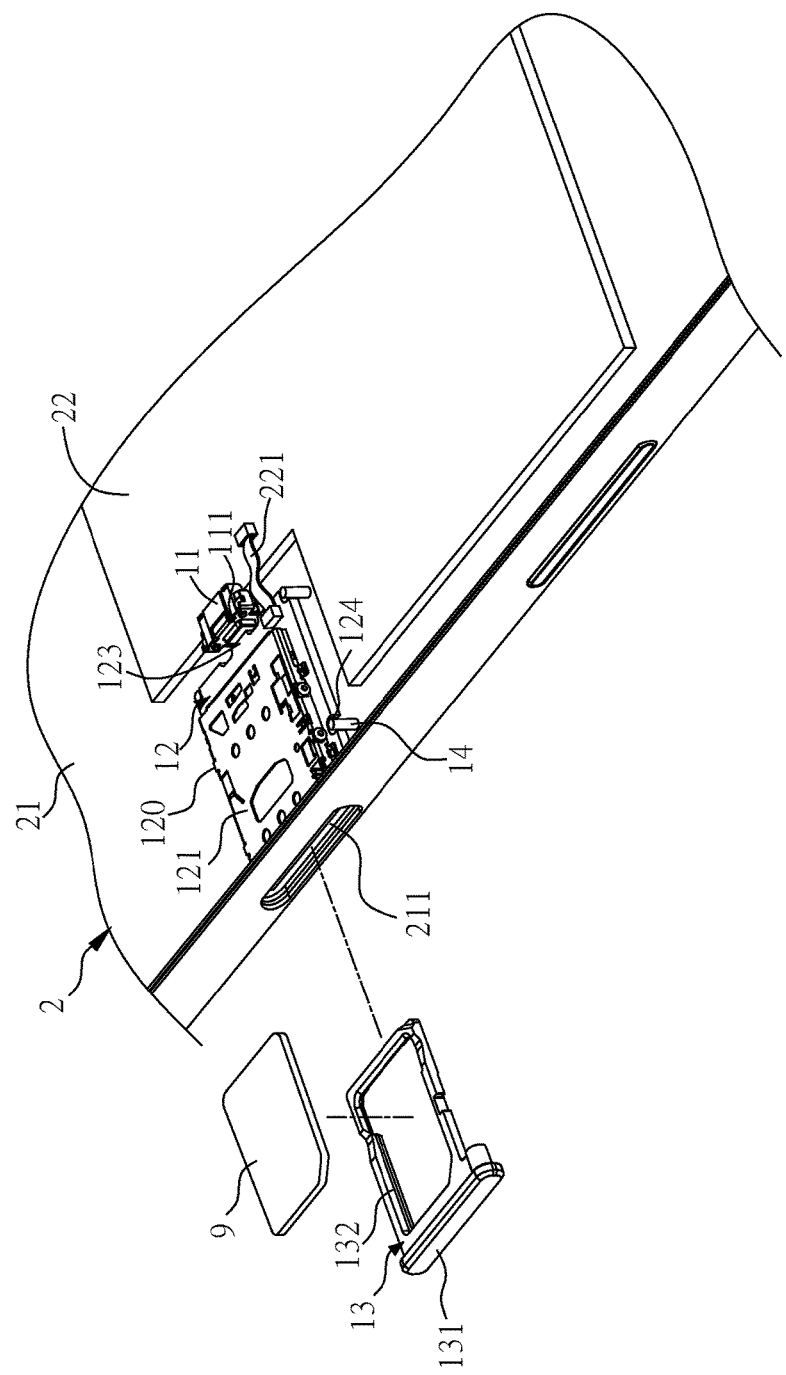
FIG. 2 is a partially exploded schematic diagram of the connector module shown in FIG. 1.

FIG. 1 is a schematic diagram of the connector module according to an embodiment of the invention. FIG. 2 is a partially exploded schematic diagram of the connector module shown in FIG. 1. Referring to FIG. 1 and FIG. 2, the connector module 1 according to the embodiment is disposed at a portable electronic device 2, and the connector module 1 can accommodate an IC card 9 for the IC card 9 to be inserted. For example, the portable electronic device 2 may be a smartphone or a tablet PC with telecommunication functionalities, and has a housing 21 and a circuit board 22. The circuit board 22 is disposed inside the housing 21. The IC card 9 may be but not limited to a SIM card (Subscriber Identification Module card), a micro SIM card, an SD memory card (Secure Digital memory card), etc. These are for exemplary purpose only without limiting sense.

In the present embodiment, the connector module 1 includes a switch component 11, a connector 12 and a button assembly 13. The switch component 11 may be the switch of a power button or a volume button. The invention is not limited therein. In the present embodiment, the switch component 11 is the switch of a power button. The switch component 11 is disposed inside the housing 21 and is electrically connected with the circuit board 22. Alternatively, the switch component 11 may be disposed at the circuit board 22 directly and electrically connected with the circuit board 22.

Moreover, the housing 21 of the present embodiment has an opening 211, and the switch component 11 and opening 211 are disposed with a distance in between. In the present embodiment, the connector 12 is disposed at the housing 21 and is movable between the opening 211 and the switch component 11. Please refer to FIG. 3, which is a top view of the connector module shown in FIG. 1. Specifically, in the present embodiment, the distance L1 between the switch component 11 and the opening 211 is greater than the length L2 of one side edge 120 of the connector 12, and the side edge 120 is parallel to the line connected from the switch component 11 to the opening 211. By such arrangement, the connector 12 can move between the switch component 11 and the opening 211, and the side edge 120 is parallel to the moving direction of the connector 12.

The connector 12 is for accommodating the IC card 9, and can be selected depending on the type of the IC card 9. The connector 12 is electrically connected with the circuit board 22 so that the IC card 9 can be electrically connected with the circuit board 22 through the connector 12. Specifically speaking, the circuit board 22 may have a flexible printed circuit 221, and the connector 12 of the present embodiment includes an accommodation housing 121 for accommodating the IC card 9. The IC card 9 may be inserted into the accommodation housing 121 through the opening 211, and the IC card 9 and button assembly 13 are secured by the accommodation housing 121. One surface of the connector 12 has a connection terminal disposed at the accommodation housing 121. One end of the flexible printed circuit 221 is connected with the connection terminal, and another is electrically connected with the circuit board 22. That is, the connection terminal of the connector 12 and the circuit board 22 of the portable electronic device 2 are electrically connected by the flexible printed circuit 221.

The button assembly 13 is inserted at the opening 211 and abuts against the connector 12. The pressed button assembly 13 can drive the connector 12 to touch the switch component 11. Specifically speaking, the button assembly 13 of the embodiment 13 includes a button portion 131 and a bearing portion 132. The button portion 131 is for the user to press, while the bearing portion 132 is for bearing the IC card 9 and is inserted at the accommodation housing 121. More specifically, the user can place the IC card 9 at the bearing portion 132, and then insert the button assembly 13 at the opening 211. That is, the bearing portion 132 together with the IC card 9 passes through the opening 211 to be inserted at the accommodation housing 121 of the connector 12, and the button assembly 13 and the IC card 9 are fixed by the accommodation housing 121. When the IC card 9 is inserted at the accommodation housing 121, the IC card 9 contacts the connection terminal of the connector 12, and electrically connected with the circuit board 22 via the flexible printed circuit 221 and the connector 12, so that the portable electronic device 2 can read the IC card 9.

Figure 3:
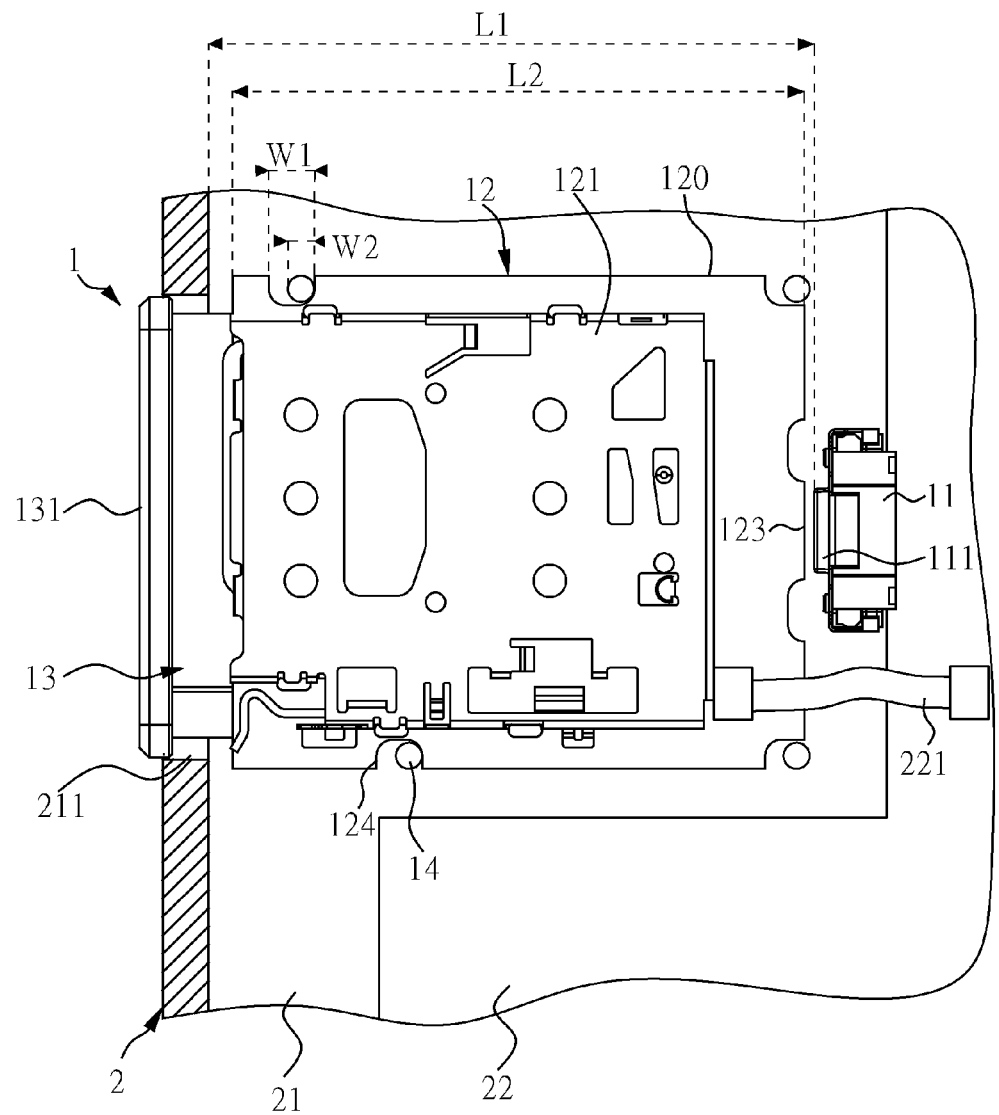
FIG. 3 is a top view of the connector module shown in FIG. 1.

Moreover, when the user inserts the bearing portion 132 together with the IC card 9 to the accommodation housing 121, one end of the button portion 131 is protruded from the opening 211 for the user to press, and another end of the button portion 131 abuts against the accommodation housing 121. Before the user presses the button portion 131, the connector 12 is separated from the switch component 11 without any contact, as shown in FIG. 3. Since in the present embodiment the connector 12 is a movable component, the button assembly 13 can drive the connector 12 to touch the switch component 11 after being pressed. Therefore, except for the separated state mentioned above, there is another touched stated between the connector 12 and the switch component 11.

Figure 4:
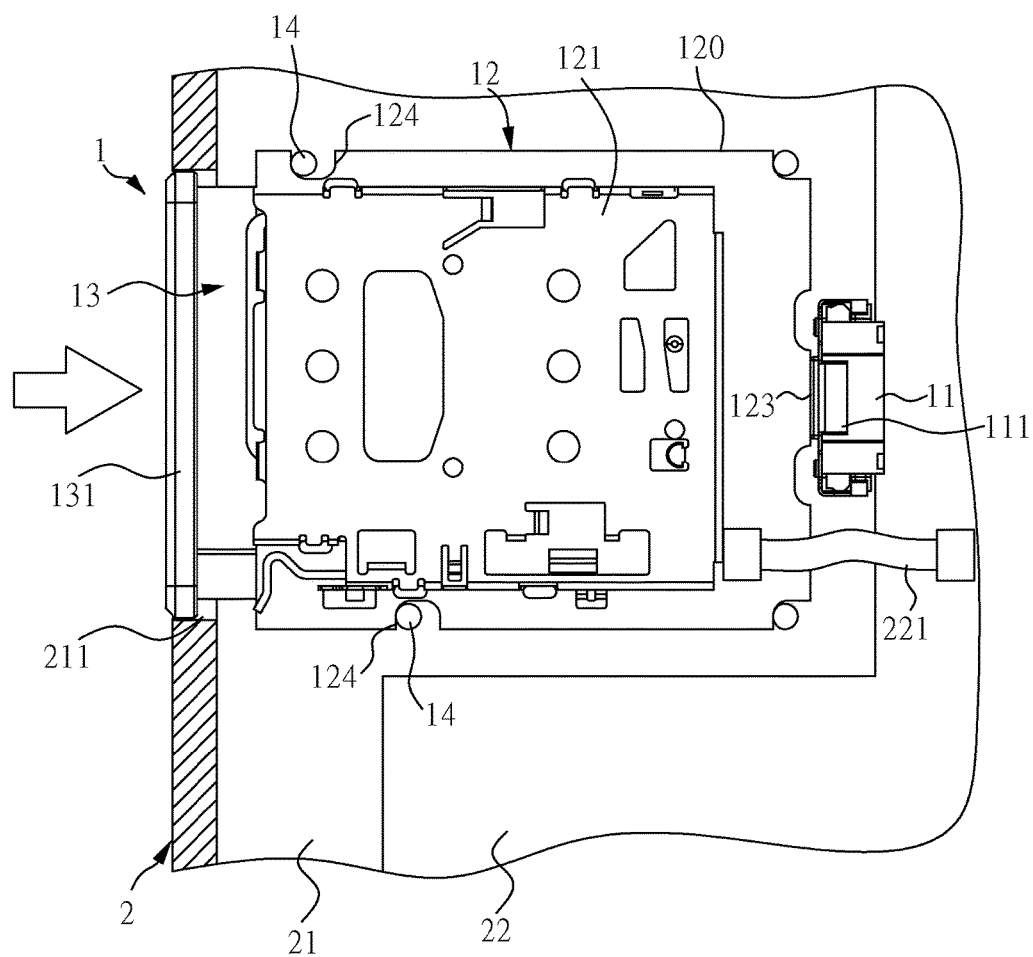
FIG. 4 is a schematic diagram showing the operation of the button portion of FIG. 3 when being pressed.

Specifically speaking, the switch component 11 of the present embodiment is the switch of a power button for exemplary purpose. When the user wants to turn on or off the power of the portable electronic device 2, he or she can press the button portion 131. FIG. 4 is a schematic diagram showing the button portion of FIG. 3 being pressed. As shown in FIG. 4, when the button portion 131 is pressed by the user, since the button assembly 13 is inserted at the accommodation housing 121, the button assembly 13 can drive the connector 12 to move along the direction the user exerting the pressing force (the direction depicted by the arrow in FIG. 4), so that the connector 12 moves toward the switch component 11 and touches the switch component 11 to enter into the touched state.

At this moment, when the switch component 11 is touched by the connector 12, the switch component 11 is triggered to generate a triggering signal to the circuit board 22. The circuit board 22 executes the procedure of turning on or off the screen according to the triggering signal. The triggering signal sent to the circuit board may also be a power-on signal or a power-off signal. For example, it can be defined that a power-off sequence is executed when the duration of the triggering signal is longer than a predetermined time period, such as 5 seconds, and a power-on sequence is executed if the duration is shorter than the predetermined time period. Therefore, when the user long-presses the button portion 131 to generate a triggering signal lasted more than 5 seconds, the circuit board 22 executes the power-off sequence. To the contrary if the duration of the press of the button portion 131 is shorter than 5 seconds, the circuit board 22 executes the power-on sequence. Moreover, it can be defined that a process of turning on the screen can be executed if the duration of the triggering signal is shorter than the predetermined time period (5 seconds). In other embodiments, the switch component 11 may also be used with a volume button, and the triggering signal may be the signal of increasing or decreasing the sound volume.

Like an ordinary switch, the switch component 11 of the present embodiment also has an elastic mechanism. When the user stops pressing the button portion 131, that is, when the button portion 131 is not pressed, the switch component 11 provides elastic force to the connector 12, so that the connector 12 moves away from the switch component 11 and toward the opening 211 to separate the connector 12 from the switch component 11 to enter into the separated state as shown in FIG. 3.

Preferably, the switch component 11 includes an elastic member 111 provided in parallel to the moving direction of the connector 12 and disposed at the side of the switch component 11 toward the connector 12. Moreover, the side of the connector 12 toward the switch component 11 may have a protrusion 123, the position of which corresponds to the position of the elastic member 111. By having the protrusion 123 touch the elastic member 111, which member may include a spring or any other elastic component, when the connector 12 touches the switch component 11, the protrusion 123 also touches the elastic member 111 to compress the elastic member 111. When the user stops pressing the button portion 131, the elastic member 111 provides a restoring force to the protrusion 123 of the connector 12, so that the connector 12 moves toward a direction away from the switch component 11.

In other embodiments, the elastic member (not shown in the drawing) may be disposed at the connector 12, and the direction of the disposition of the elastic member is in parallel to the moving direction of the connector 12. When the button portion 131 is pressed and the connector 12 moves toward the switch component 11, the elastic member is stretched, and the switch component 11 generates the triggering signal to the circuit board 22 when being touched by the connector 12. When the button portion 131 stops to be pressed, the elastic member provides a restoring force so that the connector 12 moves away from the switch component 11.

Preferable, referring to FIG. 3 and FIG. 4, the connector module 1 of the present embodiment further has four first position-limiting members 14 disposed at the housing 21 and located at the two relative side edges 120 of the connector 12, respectively. The two relative side edges 120 are parallel to the moving direction of the connector 12. Generally speaking, the connector 12 is a rectangle component, and the first position-limiting members 14 may be disposed near the four corners of the connector 12. Moreover, the first position-limiting members 14 are convex posts to limit the connector 12 to move between the switch component 11 and the opening 211 within the area defined by the first position-limiting members 14.

Preferable, the connector 12 of the present embodiment further has second position-limiting members 124 co-operating with the first position-limiting members 14 so that the connector 12 can drive the second position-limiting members 124 to move with respect to the first position-limiting members 14. Specifically speaking, the first position-limiting members 14 of the present embodiment are convex posts, and the corresponding second position-limiting members 124 may be rails so that the convex posts can be accommodated at the rails. Moreover, the width of the rails W1 is larger than the width of the convex posts W2, as shown in FIG. 3. Therefore when the connector 12 moves between the switch component 11 and the opening 211, the rails can move with respective to the convex posts. Therefore, in the present embodiment, the width W1 of the rails (the second position-limiting members 124) substantially equals to the moving distance of the connector 12.

Of course, in other embodiments, the width W1 of the first position-limiting members 14 may substantially equal to the moving distance of the connector 12. For example, the first position-limiting members 14 may be grooves, and the width of the grooves (the first position-limiting members 14) substantially equal to the moving distance of the connector 12. Correspondingly, the second position-limiting members 124 may be convex posts that co-operate with the first position-limiting members 14, that is, convex posts that are accommodated in the grooves. When the connector 12 moves between the switch component 11 and the opening 211, the convex posts may move in the grooves and the moving distance is the width of the grooves.

In one embodiment, if the connector module 1 has the first position-limiting members 14 only and does not have the second position-limiting members 124, then at least two first position-limiting members 14 are required at the two respective side edges 120 of the connector 12, as mentioned previously, and the side edges 120 are parallel to the moving direction of the connector 12, so that the connector 12 moves in the defined area. Furthermore, in another embodiment, if the first position-limiting members 14 and corresponding second position-limiting members 124 are both available, only one set of the first position-limiting members 14 and the second position-limiting members 124 are required. By the co-operation of the first position-limiting members 14 and the second position-limiting members 124, the effect of moving the connector 12 within the defined area and along the specific direction for a specific distance can be achieved.

To sum up, the connector module and the portable electronic device mounted with such connector module according to the invention include a switch component, a connector and a button assembly. The connector is for accommodating an IC card, and the IC card is electrically connected with the circuit board of the portable electronic device via the connector to achieve the basic function of the connector. The connector of the invention is movably disposed between the opening and the switch component and the button assembly abuts against the connector. With this structure, when a user presses the button assembly, the connector is driven to move and touch the switch component to achieve the effect of triggering the switch component. Therefore, the connector module of the invention integrates the structures and functions of the connector and the button. In addition to saving space, the invention further reduces the number of the openings of the housing of the portable electronic device, which enhance the aesthetic effect.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A connector module mounted at a portable electronic device, the portable electronic device including a housing and a circuit board, the circuit board being disposed in the housing, the housing having an opening, the connector module including:
    a switch component disposed at the housing and electrically connected with the circuit board;
    a connector movably disposed between the opening and the switch component, the connector electrically connected with the circuit board, the connector being for accommodating an IC card, so that the IC card is capable of being electrically connected with the circuit board via the connector; and
    a button assembly inserted at the opening and abutting against the connector, the button assembly driving the connector to touch the switch component when being pressed.

2. The connector module according to claim 1, wherein the connector includes an accommodation housing, the accommodation housing is for accommodating the IC card, the button assembly includes a button portion and a bearing portion, one end of the button portion is protruded from the opening, another end of the button portion abuts against the accommodation housing, the bearing portion bears the IC card and is inserted at the accommodation housing.

3. The connector module according to claim 2, wherein when the button portion is pressed to make the connector move toward the switch component and touch the switch component, the switch component generates a triggering signal to the circuit board.

4. The connector module according to claim 3, wherein when the button portion is stopped to be pressed, the connector moves away from the switch component to separate the connector from the switch component.

5. The connector module according to claim 4, wherein the switch component further includes an elastic member disposed in parallel to a moving direction of the connector, when the connector touches the switch component, the elastic member is compressed, when the button portion is stopped to be pressed, the elastic member provides a restoring force to the connector, so that the connector moves away from the switch component.

6. The connector module according to claim 4, wherein the connector further includes an elastic member disposed in parallel to a moving direction of the connector, when the button portion is pressed, the connector moves toward the switch component, the elastic member is stretched, when the button portion is stopped to be pressed, the elastic member provides a restoring force to the connector, so that the connector moves away from the switch component.

7. The connector module according to claim 1, wherein the distance from the switch component to the opening is longer than the length of one of the side edges of the connector, and the side edge is in parallel to a moving direction of the connector.

8. The connector module according to claim 1, further including:
    at least two first position-limiting members disposed at the housing, the two first position-limiting members located at relative two side edges of the connector, respectively, and the two side edges being in parallel to a moving direction of the connector.

9. The connector module according to claim 1, further including:
    at least one first position-limiting member disposed at the housing, the connector having at least one second position-limiting member co-operating with the first position-limiting member, and the connector being capable of driving the second position-limiting member to move with respect to the first position-limiting member.

10. The connector module according to claim 9, wherein the first position-limiting member is a convex post, the second position-limiting member is a rail, and the convex post is disposed at the rail.

11. A portable electronic device, including:
    a housing having an opening;
    a circuit board disposed in the housing; and
    a connector module including:
    a switch component disposed at the housing and electrically connected with the circuit board;
    a connector movably disposed between the opening and the switch component, the connector electrically connected with the circuit board, the connector being for accommodating an IC card, so that the IC card is capable of being electrically connected with the circuit board via the connector; and
    a button assembly pressably inserted at the opening and abutting against the connector, the button assembly driving the connector to touch the switch component when being pressed.

12. The portable electronic device according to claim 11, wherein the connector includes an accommodation housing, the accommodation housing is for accommodating the IC card, the button assembly includes a button portion and a bearing portion, one end of the button portion is protruded from the opening, another end of the button portion abuts against the accommodation housing, the bearing portion bears the IC card and is inserted at the accommodation housing.

13. The portable electronic device according to claim 12, wherein when the button portion is pressed to make the connector move toward the switch component and touch the switch component, the switch component generates a triggering signal to the circuit board.

14. The portable electronic device according to claim 13, wherein when the button portion is stopped to be pressed, the connector moves away from the switch component to separate the connector from the switch component.

15. The portable electronic device according to claim 14, wherein the switch component further includes an elastic member disposed in parallel to a moving direction of the connector, when the connector touches the switch component, the elastic member is compressed, when the button portion is stopped to be pressed, the elastic member provides a restoring force to the connector, so that the connector moves away from the switch component.

16. The portable electronic device according to claim 14, wherein the connector further includes an elastic member disposed in parallel to a moving direction of the connector, when the button portion is pressed, the connector moves toward the switch component, the elastic member is stretched, when the button portion is stopped to be pressed, the elastic member provides a restoring force to the connector, so that the connector moves away from the switch component.

17. The portable electronic device according to claim 11, wherein the distance from the switch component to the opening is longer than the length of one of the side edges of the connector, and the side edge is in parallel to a moving direction of the connector.

18. The portable electronic device according to claim 11, wherein the connector module further includes at least two first position-limiting members disposed at the housing, the two first position-limiting members are located at relative two side edges of the connector, respectively, and the two side edges are in parallel to a moving direction of the connector.

19. The portable electronic device according to claim 11, wherein the connector module further includes at least one first position-limiting member disposed at the housing, the connector has at least one second position-limiting member co-operating with the first position-limiting member, and the connector is capable of driving the second position-limiting member to move with respect to the first position-limiting member.

20. The portable electronic device according to claim 19, wherein the first position-limiting member is a convex post, the second position-limiting member is a rail, and the convex post is disposed at the rail.

* * * * *